United States Patent

Sakamoto et al.

[11] 4,047,118
[45] Sept. 6, 1977

[54] TRANSISTOR AMPLIFIER CIRCUIT

[75] Inventors: Yoshio Sakamoto; Yasuo Kominami, both of Kokubunji, Japan

[73] Assignee: Hitachi, Ltd., Japan

[21] Appl. No.: 649,745

[22] Filed: Jan. 16, 1976

[30] Foreign Application Priority Data

Jan. 16, 1975 Japan .................................. 50-6271

[51] Int. Cl.$^2$ ............................................. H03F 3/04
[52] U.S. Cl. .......................................... 330/22; 330/19; 330/30 D; 330/40
[58] Field of Search .................. 330/18, 19, 22, 30 D, 330/40, 69

[56] References Cited

U.S. PATENT DOCUMENTS

| | | | |
|---|---|---|---|
| 3,444,476 | 5/1969 | Leidich | 330/69 |
| 3,564,439 | 2/1971 | Rao | 330/22 X |
| 3,676,789 | 7/1972 | Bray | 330/30 D X |

Primary Examiner—Rudolph V. Rolinec
Assistant Examiner—Lawrence J. Dahl
Attorney, Agent, or Firm—Craig & Antonelli

[57] ABSTRACT

In a transistor amplifier circuit comprising a common-emitter amplifier transistor, a collector load resistance has one end connected with the collector of the transistor, a constant-current circuit is connected with the collector of the transistor, and an output of the transistor amplifier circuit is derived from the collector. The constant-current circuit supplies a constant current which is substantially equal to the d.c. emitter current flowing through the transistor and a d.c. voltage which establishes a d.c. voltage level of the output is applied to the other end of the collector load resistance, whereby no d.c. current is permitted to flow through the resistance.

16 Claims, 6 Drawing Figures

TRANSISTOR AMPLIFIER CIRCUIT

BACKGROUND OF THE INVENTION

1. Field of the Invention

This invention relates to a transistor amplifier circuit.

2. Description of the Prior Art

In Japanese Patent Application No. 14660/1973, entitled "Transistor amplifier circuit", as filed on Feb. 7, 1973, applicants have proposed a transistor amplifier circuit which diminishes the distortion factor without employing negative feedback.

According to the transistor amplifier circuit proposed formerly, as shown in FIG. 1, the base d.c. bias voltage $V_B$ of an amplifier transistor $Q_1$ is set at a high value, whereby the magnitude of the d.c. emitter current $I_E$ is made large, to reduce the distortion factor dependent upon an emitter junction nonlinear resistance $r_e$ based on the base-emitter voltage $V_{BE}$ - versus - emitter current $I_E$ characteristic, and therewith, a constant-current circuit CS which is composed of a transistor $Q_3$, a resistance $R_6$ and diodes $D_3$, $D_4$ is connected in parallel with a load resistance $R_L$ connected to the collector electrode of the amplifier transistor $Q_1$, whereby a d.c. voltage drop in the load resistance $R_L$ is compensated, to make possible a low supply voltage operation and a high gain amplification operation.

On the other hand, as is well known, unless the output d.c. voltage level $V_{out(DC)}$ of the transistor amplifier circuit is set at a value of about half the supply voltage $V_{cc}$, namely, at a middle point potential ($=\frac{1}{2} V_{cc}$), the output waveform of the output signal $V_{out}$ will be clipped with its upper and lower amplitude values being asymmetric, so that a large amplitude operation becomes impossible and that the output dynamic range becomes narrow.

The output d.c. voltage level $V_{out(DC)}$ of the transistor amplifier circuit shown in FIG. 1 is given by the following, letting $I_{RL}$ be a d.c. bias current which flows through the load resistance $R_L$:

$$V_{out(DC)} = V_{cc} - R_L \cdot I_{RL}$$
$$= V_{cc} - R_L \cdot (I_E - I_O)$$

In order to set the output d.c. voltage level at the middle point potential, therefore, it is necessary to precisely set the magnitude of the load resistance $R_L$ and the d.c. emitter current value $I_E$ as well as the value of the constant current $I_O$ to flow through the constant-current circuit CS. On the other hand, the voltage gain $G_V$ of such a transistor amplifier circuit is given by:

$$G_V \approx R_L/R_E$$

Accordingly, in actually designing such a transistor amplifier circuit, the magnitude of the load resistance $R_L$ must be set in consideration of both the output d.c. voltage level $V_{out(DC)}$ and the voltage gain $G_V$, and a disadvantage is that the degree of freedom of circuit design is low.

SUMMARY OF THE INVENTION

This invention, therefore, intends to eliminate such a disadvantage of the prior art, and has for its object to make the output d.c. voltage level $V_{out(DC)}$ of an amplifier circuit independent of the magnitude of the load resistance and to make it possible to freely set the voltage gain of the amplifier circuit, to enhance the degree of freedom of circuit design.

The fundamental construction of this invention for accomplishing such an object is characterized in that one end of a collector load resistance is connected with the collector electrode of an amplifier transistor, the output of the amplifier circuit is derived from the collector electrode, a d.c. voltage $+B_1$ which establishes the d.c. voltage level of the output is impressed on the other end of the collector load resistance, and a constant-current circuit is connected with the collector electrode of the amplifier transistor, whereby no d.c. current is allowed to flow through the load resistance.

DETAILED DESCRIPTION OF THE INVENTION

Figure 1:
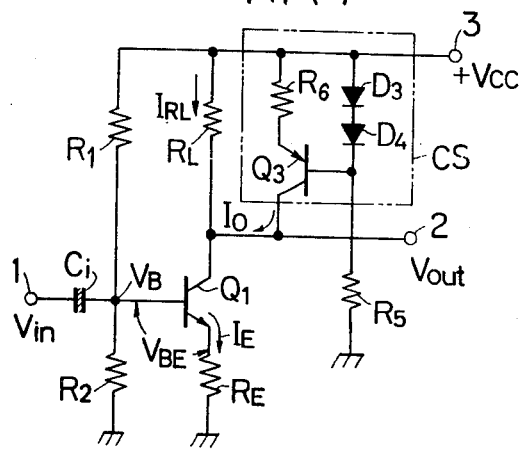
FIG. 1 shows a prior art transistor amplifier circuit.
Figure 2:
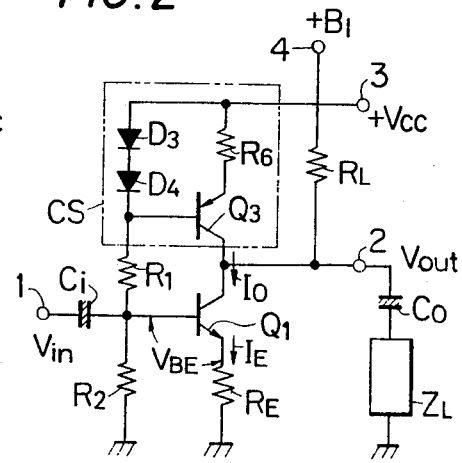
FIG. 2 shows an embodiment of the invention.

As is illustrated in FIG. 2, an amplifier circuit comprises a common-emitter amplifier transistor $Q_1$, an emitter resistance $R_E$, bias resistances $R_1$ and $R_2$, and input capacitor $C_i$, an input terminal 1, an output terminal 2, and a power supply terminal 3. An input signal $V_{in}$ is applied to the input terminal 1, a supply voltage $+V_{cc}$ is applied to the power supply terminal 3, and an output signal $V_{out}$ is derived from the output terminal 2. One end of a collector load resistance $R_L$ is connected with the collector electrode of the amplifier transistor $Q_1$, while a d.c. voltage $+B_1$ which establishes the d.c. voltage of the output is applied to the other end of the collector load resistance $R_L$. Connected with the collector electrode is a constant-current circuit CS which is composed of diodes $D_3$ and $D_4$, a resistance $R_6$ and a transistor $Q_3$. The value of a constant current $I_O$ which is supplied from the constant-current circuit is set to be equal to the value of a d.c. emitter current $I_E$ which flows through the amplifier transistor $Q_1$. A load resistance $Z_L$ which has an impedance much greater than the collector load resistance $R_L$ is connected through an output capacitor $C_o$ to the output terminal 2.

In accordance with this embodiment, in the no-signal state, all of the constant current $I_O$ fed from the constant-current circuit CS flows into the amplifier transistor $Q_1$, and no d.c. bias current flows through the collector load resistance $R_L$. Therefore, the output voltage d.c. level $V_{out(DC)}$ at the output terminal 2 is determined by the d.c. voltage $+B_1$ impressed on the other end of the collector load resistance $R_L$, and it depends on neither the supply voltage $+V_{cc}$ nor the magnitude of the collector load resistance $R_L$. On the other hand, where the input signal $V_{in}$ is impressed on the input terminal 1, a signal current responsive to the input signal $V_{in}$ flows through the collector load resistance $R_L$, and the voltage gain $G_V$ becomes nearly $R_L/R_E$.

Figure 3:
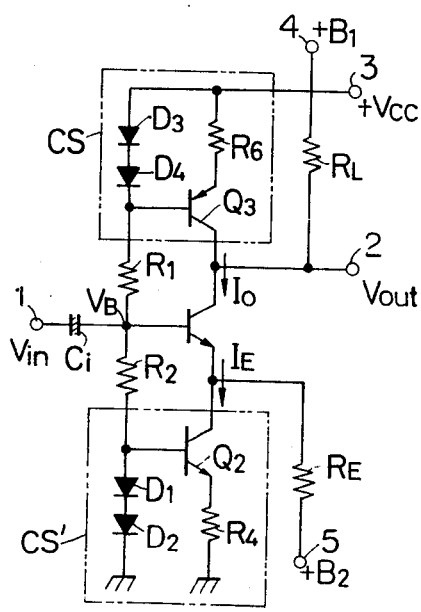
FIGS. 3 to 6 show transistor amplifier circuits according to further embodiments of this invention.

A second embodiment of the invention is illustrated in FIG. 3, wherein a second d.c. voltage $+B_2$ (whose voltage value is nearly $V_B - V_{BE}$) is applied to the other end of the emitter resistance $R_E$ in the foregoing embodiment of FIG. 2. Also, to the emitter electrode of the amplifier transistor $Q_1$, there is connected a constant-current circuit CS' which is composed of diodes $D_1$ and $D_2$, a resistance $R_4$ and a transistor $Q_2$ and which absorbs a constant current $I_E$ substantially equal in value to the constant current $I_O$ supplied from the constant-current circuit CS. Thus, no d.c. bias current flows through the emitter resistance $R_E$.

Figure 4:
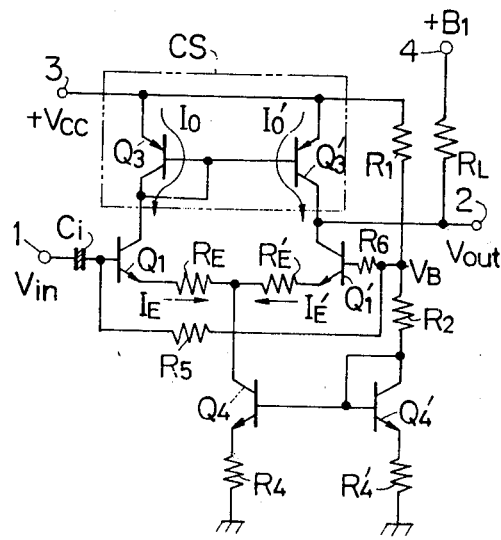

In a third embodiment illustrated in FIG. 4, in a transistor differential amplifier circuit having differential amplifier transistors $Q_1$ and $Q_1'$, one end of a collector load resistance $R_L$ is connected with the collector electrode of the differential amplifier transistor $Q_1'$, the output of the amplifier circuit is derived from the collector electrode, a d.c. voltage $+B_1$ which establishes a d.c. voltage level at the output is applied to the other end of the collector load resistance $R_L$, and a constant-current circuit CS which is composed of a diode-connected transistor $Q_3$ and a transistor $Q_3'$, with its base connected to the base of the transistor $Q_3$, is connected with the respective collector electrodes of the amplifier transistors $Q_1$ and $Q_1'$. The bases of the amplifier transistors $Q_1$ and $Q_1'$ are biased by a d.c. bias voltage $V_B$ at the juncture between bias resistances $R_1$ and $R_2$. The emitters of the amplifier transistors $Q_1$ and $Q_1'$ are mutually connected through emitter resistances $R_E$ and $R_E'$, and they are connected with the collector of a transistor $Q_4$ of a constant-current circuit. An input signal $V_{in}$ is applied to an input terminal 1, and is further applied to the base of the differential amplifier transistor $Q_1$ through an input capacitor $C_i$. The emitter resistances $R_E$, $R_E'$ and bias resistances $R_5$, $R_6$ respectively satisfy the relations $R_E = R_E'$ and $R_5 = R_6$. Under the no-signal state, therefore, the relation $I_E = I_E' = I_O = I_O'$ holds among d.c. emitter currents $I_E$, $I_E'$ which flow through the differential amplifier transistors $Q_1$, and $Q_1'$ and constant currents $I_O$, $I_O'$ which flow through the transistors $Q_3$ and $Q_3'$ of the constant-current circuit CS, and no d.c. bias current flows through the collector load resistance $R_L$. Therefore, the output d.c. voltage level $V_{out(DC)}$ at an output terminal 2 is determined by the d.c. voltage $+B_1$ impressed on the other end of the collector load resistance $R_L$, and it depends on neither the supply voltage $+V_{cc}$ nor the magnitude of the collector load resistance $R_L$. On the other hand, where the input signal $V_{in}$ is applied to the input terminal 1, a differential signal current responsive to the input signal flows through the collector load resistance $R_L$. Further, due to the differential signal current, a signal current equal to the differential signal current is supplied from the transistor $Q_3'$ of the constant-current circuit CS to the collector load resistance. Therefore, the voltage gain $G_V$ becomes twice the gain of a conventional differential amplifier and is approximately given by the following equation:

$$G_V \approx \frac{2 g_m}{1 + 2 R_E g_m} \cdot R_L$$

where
$g_m = qI_E / 4KT$
$q$ is the electronic charge,
$I_E$ is the d.c. emitter current,
$k$ is Boltzmann's constant, and
$T$ is absolute temperature.

Figure 5:
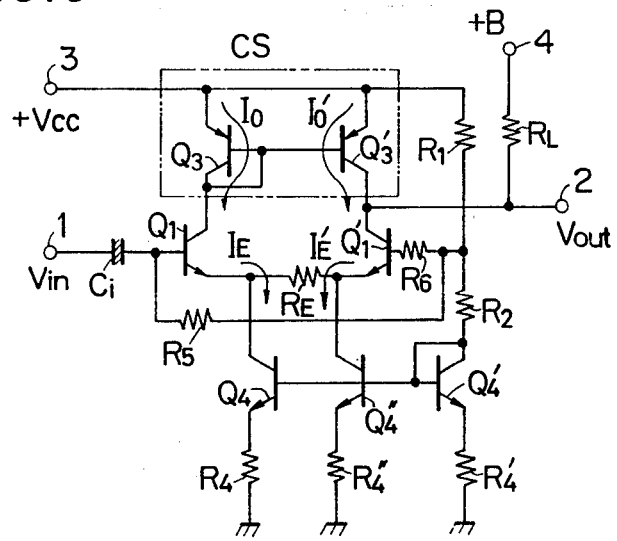

FIG. 5 is a circuit diagram showing a fourth embodiment of the invention. It is different from the third embodiment in that the respective emitters of the differential amplifier transistors $Q1$, $Q_1'$ are mutually connected through a single emitter common resistance $R_E$, while they are connected with the collectors of transistors $Q_4$, $Q_4''$ of the constant-current circuit. In order that no d.c. bias current may flow through the emitter common resistance $R_E$ under the no-signal state, resistances $R_4$ and $R_4''$ are set at equal values.

Figure 6:
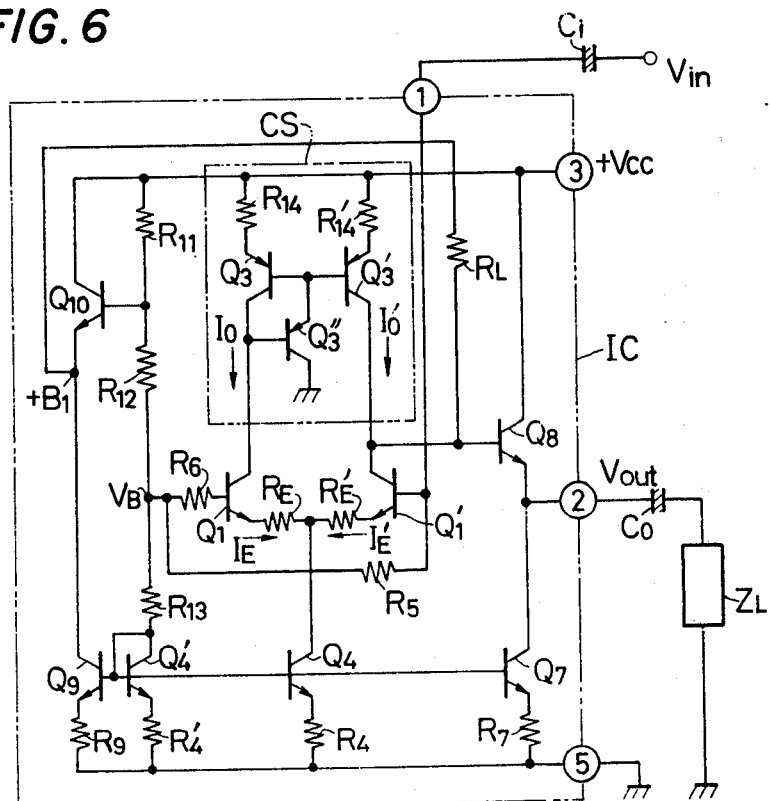

FIG. 6 shows a more concrete embodiment of this invention. All transistors and resistances inside a broken line IC are formed within a single silicon chip by a well-known manufacturing method, and form a monolithic semiconductor integrated circuit. Numerals enclosed with circles indicate terminal numbers of the monolithic semiconductor integrated circuit and terminal No. 1 is an input terminal, terminal No. 2 is an output terminal, terminal No. 3 is a power supply terminal and terminal No. 5 is a ground terminal. The emitters of differential amplifier transistors $Q_1$, $Q_1'$ are mutually connected through emitter resistances $R_E$, $R_E'$, and are also connected with the collector of a transistor $Q_4$ of a constant-current circuit. The bases of the transistors $Q_1$, and $Q_1'$ are respectively connected through bias resistances $R_6$, $R_5$ to a divider resistance bias network $R_{11}$, $R_{12}$, $R_{13}$, $Q_4'$, $R_4'$, and have a d.c. bias voltage $V_B$ applied thereto. One end of a collector load resistance $R_L$ is connected to the collector electrode of the differential amplifier transistor $Q_1'$, the output of the amplifier circuit is derived from the collector electrode, and the final output signal $V_{out}$ is derived at the terminal No. 2 through an emitter follower circuit $Q_8$, $Q_7$, $R_7$. The emitter follower circuit is provided in order to obtain a constant output irrespective of the magnitude of the impedance of a load resistance $Z_L$ which is connected through an output capacitor $C_0$ to the terminal No. 2. A dc. voltage $+B_1$ obtained from the divider resistance bias network is impressed on the other end of the collector load resistance $R_L$ through a second emitter follower circuit $Q_{10}$, $Q_9$, $R_9$, to establish the d.c. level of the output voltage at the terminal No. 2. Further, a constant-current circuit CS is connected to the respective collector electrodes of the amplifier transistors $Q_1$, $Q_1'$, the circuit CS being composed of transistors $Q_3$, $Q_3'$, the bases of which are commonly connected and a transistor $Q_3''$ which has its emitter connected to the base of the transistor $Q_3$, has its base connected to the collector thereof and has its collector grounded. At input signal $V_{in}$ is applied through an input capacitor $C_i$ to the terminal No. 1, and is further introduced into the base of the differential amplifier transistor $Q_1'$. Resistances $R_E$, $R_E'$; $R_5$, $R_6$; and $R_{14}$, $R_{14}'$ within the integrated circuit respectively satisfy the relations $R_E = R_E'$; $R_5 = R_6$; and $R_{14} = R_{14}'$. In the no-signal state, therefore, the relation of $I_E = I_E' = I_O = I_O'$ holds among d.c. emitter currents $I_E$, $I_E'$ which flow through the differential amplifier transistors $Q_1$, $Q_1'$ and constant currents $I_O$, $I_O'$ which flow through the transistors $Q_3$, $Q_3'$ of the constant-current circuit CS. Consequently, the output d.c. voltage level $V_{out(DC)}$ at the terminal No. 2. is determined by the d.c. voltage $+B_1$ and depends on neither the supply voltage $+V_{cc}$ nor the magnitude of the collector load resistance $R_L$. On the other hand, where the input signal $V_{in}$ is applied to the terminal No. 1, a differential signal current responsive to the input signal flows through the collector load resistance $R_L$, and the output signal $V_{out}$ based on the voltage gain $G_V$ expressed by Eq. (1) is obtained at the terminal No. 2.

In accordance with the present invention described above, the expected object can of course be achieved, and the following effects can be acquired:

1. Since no d.c. bias current flows through the collector load resistance, the value of the collector load resistance can be freely set to be large, and hence, the gain of the amplifier circuit can be made sufficiently high.

2. The distortion factor dependent upon the emitter junction nonlinear resistance $r_e$ has hitherto been reduced by using negative feedback, while according to this invention it can be decreased by making the value of the d.c. emitter current $I_E$ to flow through the amplifier transistor large. Therefore, the amplifier circuit can be a no-feedback high gain amplifier and a phase compensating capacitor heretofore required in a negative feedback type amplifier circuit becomes unnecessary. When this invention is applied to a monolithic semiconductor integrated circuit, terminals for externally mounting the above capacitor becomes unnecessary, and the product price of the integrated circuit can be made low.

We claim:

1. In a transistor amplifier circuit having
   an input terminal to which signals to be amplified are applied;
   an output terminal;
   a common-emitter transistor having its base electrode connected to said input terminal and its collector electrode connected to said output terminal;
   a power supply terminal to which a power supply voltage is applied; and
   a constant-current circuit connected between said power supply terminal and the collector of said common-emitter transistor;
   the improvement comprising:
   means for setting a D.C. voltage level at the collector of said common-emitter transistor including a D.C. voltage terminal to which a prescribed D.C. voltage exclusive of said power supply voltage is applied, and
   a load resistor connected between said D.C. voltage terminal and the collector of said common-emitter transistor, and
   wherein the value of current supplied by said constant-current circuit to the collector of said common-emitter transistor is equal to that of the D.C. emitter current of said common-emitter transistor.

2. The improvement according to claim 1, further comprising an additional constant-current circuit coupled between the emitter of said common-emitter transistor and a source of reference potential, a further D.C. voltage terminal to which a further D.C. voltage is applied, and an emitter resistor connected between the emitter of said transistor and said further D.C. voltage terminal, said additinal constant-current circuit absorbing a constant emitter current equal in value to the constant current supplied to the collector of said transistor.

3. A differential amplifier circuit comprising:
   an input terminal to which a voltage input is applied;
   an output terminal;
   a power supply terminal to which a power supply voltage is applied;
   first and second transistors, the emitters of which are coupled together, the base of said first transistor being connected to said input terminal, and the collector of said second transistor being connected to said output terminal;
   a constant-current circuit connected between said power supply terminal and the collectors of said transistors;
   means for setting a D.C. voltage level at the collector of said second transistor including a D.C. voltage terminal to which a prescribed D.C. voltage exclusive of said power supply voltage is applied; and
   a load resistor connected between said D.C. voltage terminal and the collector of said second transistor.

4. A differential amplifier circuit according to claim 3, wherein said constant current circuit supplies respective constant collector currents to the collectors of said first and second transistors equal in value to the emitter currents thereof.

5. A differential amplifier circuit according to claim 4, further comprising a further constant-current circuit coupled between the emitters of said transistors and a source of reference potential.

6. A differential amplifier circuit according to claim 5, wherein the emitter of each of said transistors is connected through a respective resistor to said further constant-current circuit.

7. A differential amplifier circuit according to claim 3, wherein said constant-current circuit comprises a diode-connected transistor connected between said power supply terminal and the collector of said first transistor and a further transistor, the base of which is connected to the base of said diode-connected transistor, connected between said power supply terminal and the collector of said second transistor.

8. A differential amplifier circuit according to claim 7, further comprising a further constant-current circuit coupled between the emitters of said transistors and a source of reference potential.

9. A differential amplifier circuit according to claim 8, further comprising a bias circuit for applying a d.c. bias voltage to the bases of each of said first and second transistors.

10. A differential amplifier circuit according to claim 8, wherein said further constant current circuit comprises a further diode-connected transistor coupled between said source of reference potential and said power supply terminal, and an additional transistor, the base of which is connected to the base of said further diode connected transistor, coupled between said source of reference potential and the emitters of said first and second transistors.

11. A differential amplifier circuit according to claim 3, further comprising a further constant-current circuit coupled between the emitters of said transistors and a source of reference potential.

12. A differential amplifier circuit according to claim 11, wherein the emitters of said first and second transistors are connected to opposite ends of a resistor and directly to said further constant-current circuit.

13. A differential amplifier circuit according to claim 12, wherein said further constant current circuit comprises third and fourth transistors the bases of which are connected to a source of bias voltage, the collectors of which are connected directly to the emitters of said first and second transistors, and the emitters of which are connected through respective resistors to said source of reference potential.

14. A differential amplifier circuit according to claim 13, wherein the values of said respective resistors are the same.

15. A differential amplifier circuit according to claim 11, wherein the emitter of each of said transistors is connected through a respective resistor to said further constant-current circuit.

16. A differential amplifier circuit according to claim 15, further comprising a bias circuit for applying a d.c. bias voltage to the bases of each of said first and second transistors.

* * * * *